United States Patent [19]
Dosho

[11] Patent Number: 5,933,055
[45] Date of Patent: *Aug. 3, 1999

[54] OPERATIONAL AMPLIFIER OPERABLE WITH HIGH PERFORMANCE EVEN AT A LOW VOLTAGE

[75] Inventor: Shiro Dosho, Osaka, Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/801,073

[22] Filed: Feb. 14, 1997

[30] Foreign Application Priority Data

Feb. 15, 1996 [JP] Japan .................................. 8-027534

[51] Int. Cl.$^6$ .......................................................... H03F 3/45
[52] U.S. Cl. ............................................ 330/255; 330/261
[58] Field of Search .................................... 330/252, 253, 330/255, 257, 261

[56] References Cited

U.S. PATENT DOCUMENTS

| | | | |
|---|---|---|---|
| 4,766,394 | 8/1988 | Yukawa | 330/255 X |
| 5,285,168 | 2/1994 | Tomatsu et al. | 330/253 |
| 5,293,136 | 3/1994 | Ryat | 330/258 |
| 5,337,007 | 8/1994 | Barrett et al. | 330/255 X |
| 5,361,040 | 11/1994 | Barrett, Jr. | 330/253 |
| 5,477,190 | 12/1995 | Brehmer et al. | 330/253 |

FOREIGN PATENT DOCUMENTS

| | | |
|---|---|---|
| 0 259 879 | 3/1988 | European Pat. Off. . |
| 0 318 396 | 5/1989 | European Pat. Off. . |
| 0 535 951 | 4/1993 | European Pat. Off. . |
| 5-095231 | 4/1993 | Japan . |

OTHER PUBLICATIONS

1995 IEEE International Symposium On Circuits and Systems (ISCAS), Seattle, Apr. 30–May 3, 1995, vol. 2, Institute of Electrical and Electronics Engineers, "A CMOS Rail-to--Rail Linear VI–Converter", Vervoort et al., pp. 825–828, XP000558810, Apr. 30, 1995.

Primary Examiner—Steven J. Mottola
Attorney, Agent, or Firm—McDermott, Will & Emery

[57] ABSTRACT

An operational amplifier attaining a class-AB operation with a low voltage power supply. The operational amplifier has an output buffer circuit including transistors of opposite polarity serially connected with an output there between. A first differential current amplifier and a first current mirror circuit drive one of the transistors. A level shifter that includes a second differential current amplifier, a second current mirror circuit and a current aliasing circuit drives the other transistor. The current aliasing circuit is operated at a very low voltage. With this configuration, the currents that flow through the transistors have different values, resulting in a differential current being output from the output between the transistors.

12 Claims, 15 Drawing Sheets

1 FIRST CONSTANT CURRENT SOURCE

7 FIRST CURRENT MIRROR CIRCUIT

9 SECOND CURRENT MIRROR CIRCUIT

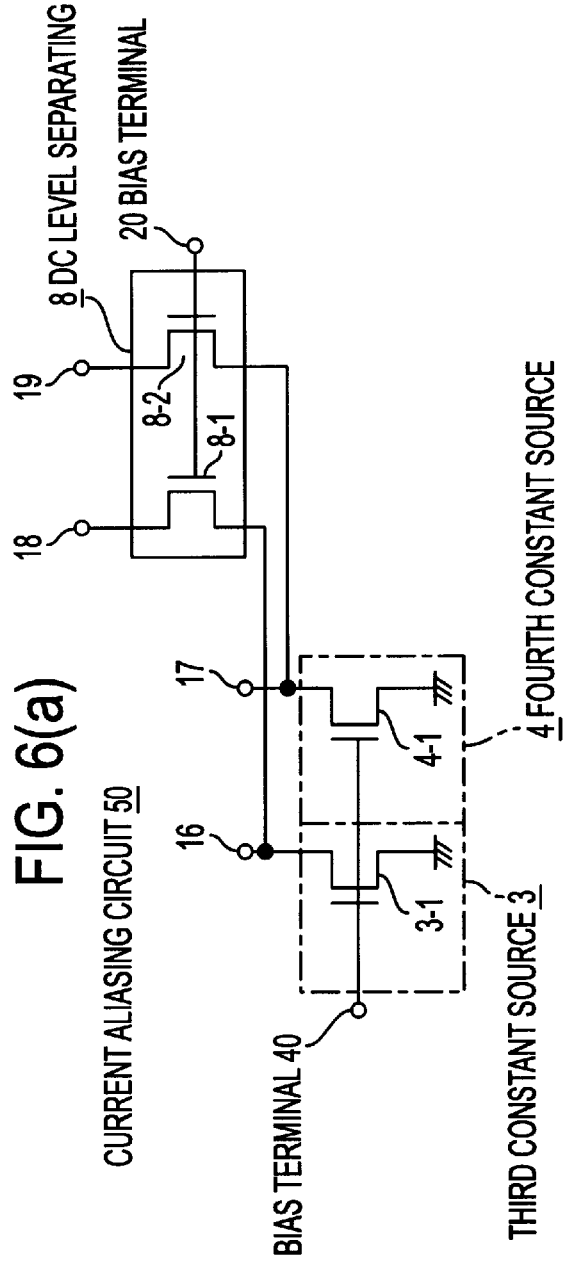
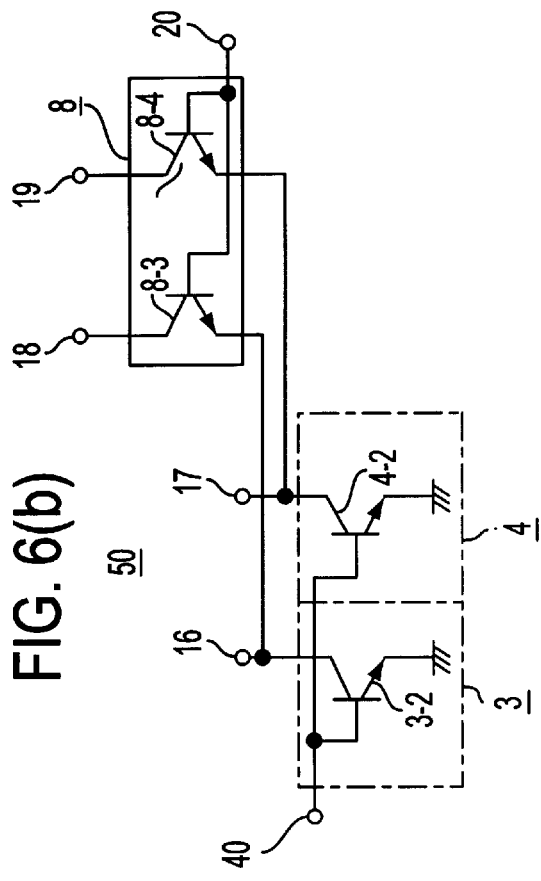

OUTPUT BUFFER CIRCUIT 22

OPERATIONAL AMPLIFIER OPERABLE WITH HIGH PERFORMANCE EVEN AT A LOW VOLTAGE

BACKGROUND OF THE INVENTION

The present invention relates to an improvement of an operational amplifier, and more particularly, it relates to an operational amplifier operable with high performance even at a low voltage.

Recently, a supply voltage for LSIs has been more and more decreased in accordance with higher integration of the LSIs. Furthermore, most of the recent LSIs are hybrid ICs including both an analog circuit and a digital circuit. Although the decreased supply voltage is advantageous in a digital circuit for decreasing power consumption and increasing an operational speed, it is not advantageous in an analog circuit because an S/N ratio and a dynamic range can be decreased.

Furthermore, in accordance with recent spread of portable equipment, an analog circuit is required to cope with various supply voltages in a wide range so as to be stably operated even at a different supply voltage. For example, with regard to electric equipment which can be either stationary or portable, such as a compact disc player, an analog circuit included in the equipment has the same configuration both in the stationary and portable equipment. Therefore, in the cases where a supply voltage of, for example, 5 V is used for the stationary equipment and a supply voltage of, for example, 2 V is used for the portable equipment, the analog circuit is required to be stably operated under application of either voltage.

Moreover, when the supply voltage is decreased, there arises another problem that an analog circuit applicable to an ordinary supply voltage cannot be used without changing its configuration.

This conventional problem will now be described with reference to FIG. 14. FIG. 14 is a diagram of a conventional CMOS operational amplifier including a class-AB output circuit. The class-AB output circuit herein means an output circuit which can drive both a PMOS transistor and an NMOS transistor at the output level with a signal. The class-AB output circuit has a large current driving ability, and hence, is used as a typical output circuit in an operational amplifier for driving a resistance.

In FIG. 14, a reference numeral 50 denotes the class-AB output circuit, which includes a series connection of a PMOS transistor 50-1 and an NMOS transistor 50-2. An output terminal 59 is connected with a node in the series connection. A reference numeral 51 denotes a constant current source, which includes a PMOS transistor 51-1. The PMOS transistor 51-1 is connected with a constant current source bias terminal 56 at its gate. A reference numeral 52 denotes a differential current amplifier at the input level, which includes two PMOS transistors 52-1 and 52-2. The differential current amplifier 52 is connected with the constant current source 51, and the PMOS transistors 52-1 and 52-2 are connected with a negative-phase input signal terminal 57 and a positive-phase input signal terminal 58, respectively at their gates. A reference numeral 53 denotes a current mirror circuit, which includes two NMOS transistors 53-1 and 53-2.

Furthermore, a reference numeral 54 denotes a level shifter, which includes a PMOS transistor 54-1 serving as a constant current source and a PMOS transistor 54-2 for level shifting an output of the differential current amplifier 52. A voltage which has been level-shifted by the PMOS transistor 54-2 is output to the gate of the PMOS transistor 50-1 of the class-AB output circuit 50. A reference numeral 55 denotes a phase compensating circuit, which includes a series connection of a resistance element 55-1 and a capacitance element 55-2.

In the configuration of FIG. 14, to a signal having been input to the differential current amplifier 52, the PMOS transistor 54-2 of the level shifter 54 adds a DC level corresponding to a gate-source voltage of the PMOS transistor 54-2, and the resultant signal is supplied to the gate of the PMOS transistor 50-1 of the class-AB output circuit 50. In a normal state where no current is output from the output terminal 59, the state of the differential current amplifier 52 should be completely symmetrical Accordingly, the following equation holds:

Equation 1:

$$Vdd = Vgs50 + Vgs54 + Vds53\text{-}2$$
$$= Vgs50 + Vgs54 + Vds53\text{-}1$$
$$= Vgs50 + Vgs54 + Vgs53\text{-}1$$

wherein Vdd indicates a supply voltage; Vgs50 indicates a gate-source voltage of the PMOS transistor 50-1 of the class-AB output circuit 50; Vgs54 indicates a gate-source voltage of the PMOS transistor 54-2 of the level shifter 54; Vds53-2 indicates a drain-source voltage of the NMOS transistor 53-2 of the current mirror circuit 53; Vds53-1 indicates a drain-source voltage of the NMOS transistor 53-1 of the current mirror circuit 53; and Vgs53-1 indicates a gate-source voltage of the NMOS transistor 53-1 of the current mirror circuit 53.

Assuming that the three MOS transistors 50-1, 54-2 and 53-1 have the same gate-source voltage Vgs and have the same threshold voltage Vth, since the gate-source voltage of each MOS transistor is required to be higher than its threshold voltage Vth, the following equation holds:

Equation 2:

$$Vdd=3\ Vgs>3\ Vth$$

Since the threshold voltage Vth is actually approximately 0.7 V and the gate-source voltage Vgs is required to be higher than the threshold voltage Vth by at least 0.2 V, the supply voltage Vdd is required to be at least 2.7 V or higher. Accordingly, when the supply voltage Vdd is set at a voltage lower than 2.7 V, the conventional operational amplifier cannot be normally operated.

Moreover, when a voltage source having a different voltage is used in the conventional operational amplifier, the value of a current flowing in the steady-state can be disadvantageously varied. This problem will be described next.

The values of currents flowing between the drains and the sources of the three MOS transistors 50-1, 54-2 and 53-1 in the steady-state are respectively represented as follows:

Equations 3:

$$Ids50=K50\ (Vgs50-Vth)^2$$
$$Ids53=K53\ (Vgs53-Vth)^2$$
$$Ids54=K54\ (Vgs54-Vth)^2$$

wherein Ids50, Ids53 and Ids54 indicate the values of the drain-source currents in the transistors 50-1, 53-1 and 54-2, respectively; and K50, K53 and K54 indicate current efficiencies of these transistors, respectively.

Since the gate-source voltages Vgs50, Vgs53 and Vgs54 are varied substantially in proportion to the supply voltage Vdd, it is understood that the drain-source current Ids50, Ids53 and Ids54 are varied in proportion to a square of the supply voltage Vdd.

The variation of the drain-source current will now be described with reference to FIG. 16. A potential at a node A in the conventional operational amplifier shown in FIG. 14 is a sum of the ground potential, the gate-source voltage Vgs53-2 of the transistor 53-2 and the gate-source voltage 54-2 of the transistor 54-2, and is determined regardless of the supply voltage Vdd. Therefore, as is shown in FIG. 16, the bias voltage (gate-source voltage) Vgs50-1 of the transistor 50-1 can be retained at a large value when the supply voltage Vdd is high, but can be decreased to a small value when the supply voltage Vdd is low. Thus, the bias voltage Vgs50-1 is varied in accordance with the supply voltage Vdd. As a result, when the supply voltage Vdd is different, a current flowing through the transistor 50-1 of the output circuit 50 is largely varied. Accordingly, the value of a current flowing in the conventional CMOS operational amplifier including the class-AB output circuit in the steady-state is largely varied in accordance with the supply voltage Vdd of a used power supply. The largely varied current value is a serious obstacle in decreasing the power consumption.

As the configuration of an operational amplifier free from this problem, for example, Japanese Laid-Open Patent Publication No. 5-95231 describes an operational amplifier comprising, in addition to a constant current source, a differential current amplifier and a current mirror circuit for controlling an NMOS transistor of an output circuit, another constant current source, another differential current amplifier and another current mirror circuit for controlling a PMOS transistor of the output circuit. In this operational amplifier, an output of the added current mirror circuit is supplied to the current control terminal of the PMOS transistor of the output circuit.

However, in the operational amplifier disclosed in the publication, the differential current amplifier for controlling the NMOS transistor of the output circuit includes two PMOS transistors, while the differential current amplifier for controlling the PMOS transistor of the output circuit includes two NMOS transistors. Since the transistors included in the respective differential current amplifiers thus have reverse polarities, one of the differential current amplifiers has an operational range between a supply voltage Vbb and a voltage Vbb-Vt which is lower than the supply voltage Vbb by a threshold voltage Vt of the transistor. Another differential current amplifier has an operational range between a ground voltage and a voltage Vt which is higher than the ground voltage by a threshold voltage of the transistor. In view of these operational ranges of the differential current amplifiers, the operational amplifier is difficult to be actually used because the input dynamic range thereof is too narrow for usage at a low supply voltage. Moreover, it is necessary to connect a diode with the bias terminal of the output buffer circuit in order to stabilize the DC level, which can disadvantageously decrease the DC gain.

SUMMARY OF THE INVENTION

A first object of the invention is providing a CMOS operational amplifier having a class-AB output which comprises two differential current amplifiers including transistors of the same polarity and that can be operated without fail at a lower voltage than the conventional operational amplifier. A second object is providing a CMOS operational amplifier having a class-AB output in which the value of a current flowing in a steady-state is not largely varied and is retained at a small value in using a power supply having a different voltage.

In order to achieve the first object, the present operational amplifier comprises a level shifter including a current aliasing circuit definitely operable at a low voltage. Furthermore, in order to achieve the second object, the level shifter is further provided with a constant current source, so that the values of currents flowing through two transistors included in an output buffer circuit can be determined merely on the basis of the value of a current flowing from the constant current source.

Specifically, the class-AB operational amplifier of this invention comprises a first power supply having a predetermined voltage; a second power supply having a voltage different from the predetermined voltage; an output buffer circuit including a serial connection of a transistor of a first polarity connected with the first power supply, a transistor of a second polarity connected with the second power supply and an output terminal provided at a node between the transistors, the transistors being driven by using an input differential signal; a first differential current amplifier including transistors of a predetermined polarity for receiving the differential signal for amplification and driving the transistor of the second polarity; and a level shifting circuit for generating a voltage to be supplied to a current control terminal of the transistor of the first polarity in order to drive the transistor of the first polarity, and in the operational amplifier, the level shifting circuit includes a constant current source for supplying a constant current; a second differential current amplifier including transistors of the same polarity as the transistors included in the first differential current amplifier for receiving the constant current from the constant current source and receiving the differential signal for amplification; a current aliasing circuit connected between the second differential current amplifier and the second power supply for looping an output current of the second differential current amplifier; and a current mirror circuit connected between the first power supply and the current aliasing circuit for allowing a current having a current value based on an output current of the current aliasing circuit to flow and to be supplied to the current control terminal of the transistor of the first polarity.

In one aspect of the operational amplifier, the current aliasing circuit includes two constant current sources respectively connected with two current output terminals of the second differential current amplifier; and a DC level separating circuit having two current output terminals for outputting currents flowing to the two current output terminals of the second differential current amplifier respectively through the two current output terminals of the DC level separating circuit and for separating a DC voltage level between the two current output terminals thereof and the two current output terminals of the second differential current amplifier.

Owing to the aforementioned configuration, the present invention attains the following functions: The operation of the transistor of the second polarity included in the output buffer circuit is controlled on the basis of an output current of the first differential current amplifier. On the other hand, the operation of the transistor of the first polarity included in the output buffer circuit is controlled on the basis of an output current of the level shifter. More specifically, in the level shifter, an output current of the second differential current amplifier is looped by the current aliasing circuit, and the current mirror circuit allows a current to flow on the basis of the looped current, so that the current from the current mirror circuit is supplied to the current control terminal of the transistor of the first polarity included in the output buffer circuit. At this point, the current aliasing circuit can be operated at a very low voltage. Therefore, even when the second differential current amplifier includes the transistors of the same polarity as those included in the first differential current amplifier and a power supply having a low voltage is used, the gate-source voltage of the transistor of the first polarity, for example, a MOS transistor included in the output buffer circuit can be retained at a value larger than its threshold voltage. Accordingly, this operational amplifier can be definitely operated even with a power supply having a low voltage.

Moreover, according to the invention, the values of the currents flowing through the two transistors included in the output buffer circuit in the steady-state are determined on the basis of the values of constant currents respectively flowing from the three constant current sources included in the level shifter. Therefore, even when a power supply having a different voltage is used, the values of the currents flowing in the steady-state can be retained constant.

The above and other objects, features and advantages of the present invention will become more apparent as the description proceeds taken in conjunction with the accompanying drawings.

BRIEF DESCRIPTION OF THE DRAWINGS

FIG. 6(a) is a diagram for showing a configuration of third and fourth current sources and a DC level separating circuit included in a current aliasing circuit of the operational amplifier, wherein NMOS transistors are used;

FIG. 6(b) is a diagram for showing another configuration of the third and fourth current sources and the DC level separating circuit included in the current aliasing circuit, wherein NPN transistors are used;

DETAILED DESCRIPTION OF THE INVENTION

The present invention will now be described with reference to the accompanying drawings.

An operational amplifier according to an embodiment of the invention will now be described referring to FIG. 1.

Figure 1:
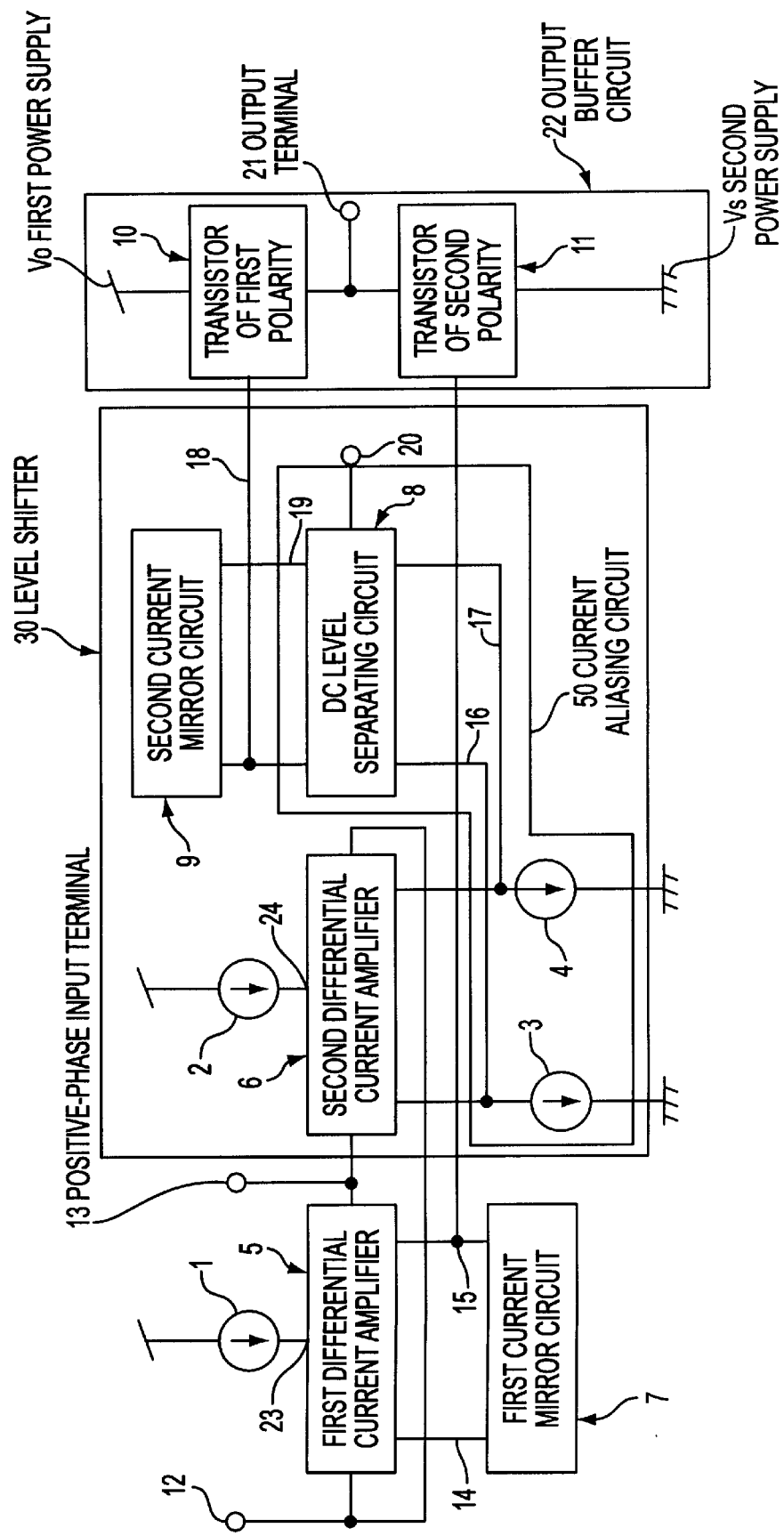
FIG. 1 is a diagram for showing the block configuration of an operational amplifier of the invention.

FIG. 1 shows the entire configuration of the operational amplifier. In FIG. 1, a reference numeral 22 denotes an output buffer circuit, which includes a serial connection of a transistor 10 of a first polarity and another transistor 11 of a second polarity. An output terminal 21 is connected with a node between the serially connected transistors 10 and 11. The transistor 10 of the first polarity is connected with a power supply (first power supply) Vo having a predetermined low voltage. The transistor 11 of the second polarity is connected with a power supply (second power supply) Vs having a ground voltage different from the predetermined low voltage. The predetermined low voltage of the first power supply is lower than a triple (3 Vt) of a threshold voltage Vt (approximately 0.7 V) of the transistor, and is specifically, for example, 1.3 V as demonstrated below.

Furthermore, a reference numeral 1 denotes a first constant current source connected with the first power supply Vo having the predetermined low voltage. A reference numeral 5 denotes a first differential current amplifier having a first current supplying terminal 23 through which a current is supplied by the first constant current source 1. The first differential current amplifier 5 is externally supplied with a differential signal through a negative-phase input terminal 12 and a positive-phase input terminal 13, amplifies the differential signal, and outputs the amplified signal through a first current output terminal 14 and a second output terminal 15. A reference numeral 7 denotes a first current mirror circuit, which is connected with the first and second current output terminals 14 and 15 of the first differential current amplifier 5.

A reference numeral 30 denotes a level shifter, which is a characteristic of the invention. The level shifter 30 includes a second constant current source 2, a second differential current amplifier 6, a current aliasing circuit 50 and a second current mirror circuit 9. The current aliasing circuit 50 includes third and fourth constant current sources 3 and 4 and a DC level separating circuit 8. The second constant current source 2 is connected with the first power supply Vo having the predetermined low voltage. The second differential current amplifier 6 is supplied with a constant current by the second constant current source 2 through a second current supplying terminal 24, receives the differential signal through the negative-phase input terminal 12 and the positive-phase input terminal 13, and outputs an amplified signal of the differential signal through third and fourth current output terminals 16 and 17. The third and fourth constant current sources 3 and 4 are connected with the third and fourth current output terminals 16 and 17 of the second differential current amplifier 6, respectively, and are also connected with a ground power supply Vs. The DC level separating circuit 8 is connected with the third and fourth current output terminals 16 and 17 of the second differential current amplifier 6, and has a bias terminal 20 and fifth and sixth current output terminals 18 and 19. The second current mirror circuit 9 is connected with the fifth and sixth current output terminals 18 and 19 of the DC level separating circuit 8. The fifth and sixth current output terminals 18 and 19 are connected with the transistor 10 of the first polarity and the transistor 11 of the second polarity of the output buffer circuit 22, respectively, so as to control the transistors 10 and 11.

Now, the configuration of each circuit will be specifically described.

Figure 2A:
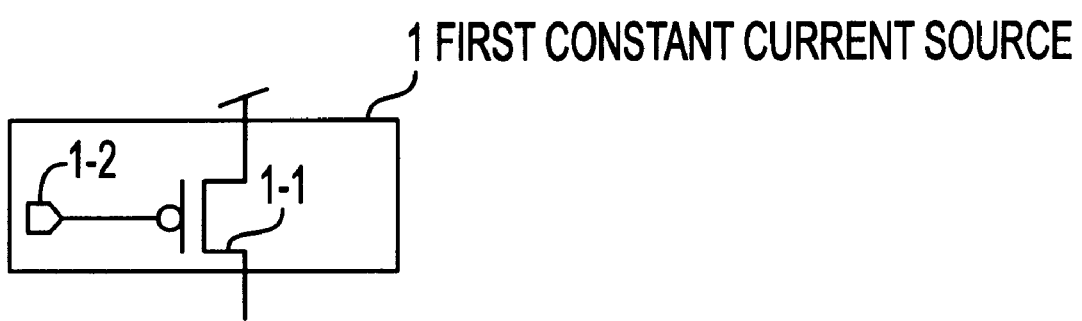
FIG. 2(a) is a diagram for showing a configuration of a first constant current source of the operational amplifier, wherein a PMOS transistor is used.
Figure 2B:
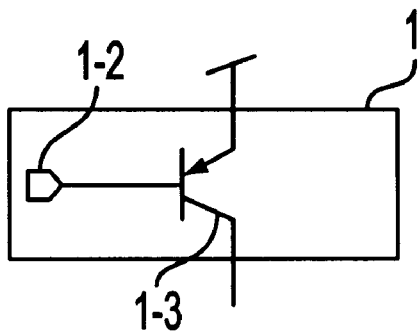
FIG. 2(b) is a diagram for showing another configuration of the first constant current source, wherein a PNP transistor is used.

FIGS. 2(a) and 2(b) show examples of the configuration of the first constant current source 1. FIG. 2(a) shows an example where a PMOS transistor is used, and FIG. 2(b) shows an example where a PNP transistor is used. In the configuration of FIG. 2(a), the first constant current source 1 includes a PMOS transistor 1-1, which is connected with the power supply Vo having the low voltage at its source and with a constant current source bias terminal 1-2 at its gate. In the configuration of FIG. 2(b), the first constant current source 1 includes a PNP transistor 1-3 similarly connected.

Figure 3A:
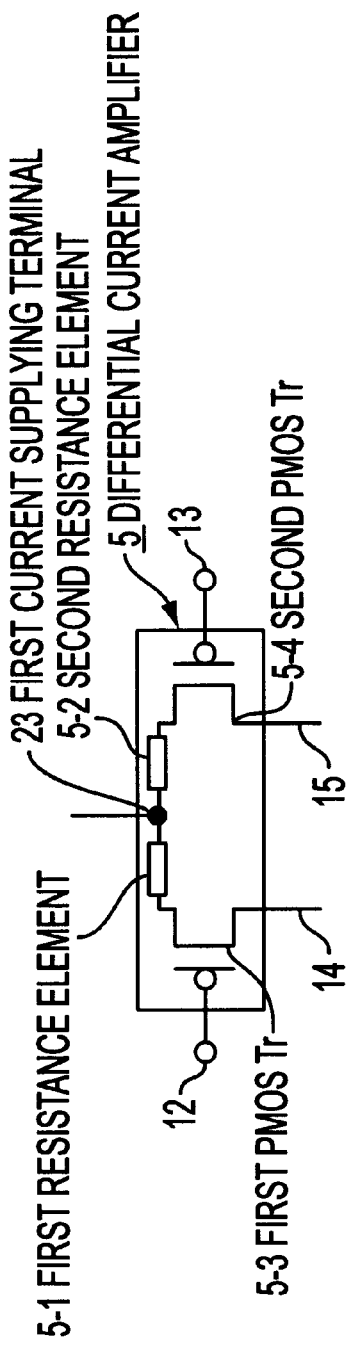
FIG. 3(a) is a diagram for showing a configuration of a differential current amplifier of the operational amplifier, wherein PMOS transistors are used.
Figure 3B:
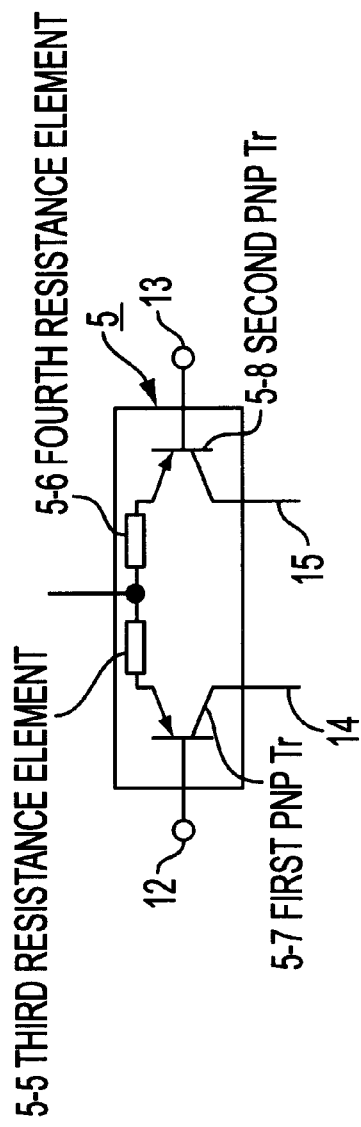
FIG. 3(b) is a diagram for showing another configuration of the differential current amplifier, wherein PNP transistors are used.

FIGS. 3(a) and 3(b) show examples of the configuration of the first differential current amplifier 5. The configuration of the second differential current amplifier 6 can be the same. FIG. 3(a) shows an example where PMOS transistors are used, and FIG. 3(b) shows an example where PNP transistors are used. These two examples adopt different types of transistors but the used transistors are connected in the same manner, and hence, merely the connection in the configuration of FIG. 3(a) will be described. In the configuration of FIG. 3(a), reference numerals 5-3 and 5-4 are first and second PMOS transistors, which are connected with the first current supplying terminal 23 at their sources through first and second resistance elements 5-1 and 5-2, respectively, with the first and second current output terminals 14 and 15, respectively at their drains, and with the negative-phase input terminal 12 and the positive-phase input terminal 13, respectively at their gates. The configuration of FIG. 3(b) similarly includes first and second PNP transistors 5-7 and 5-8 and third and fourth resistance elements 5-5 and 5-6. Each resistance element is used for suppressing distortion of the circuit. The differential current amplifier thus configured has the following current transfer characteristic: When a signal input to the positive-phase input terminal 13 has a high voltage and a signal input to the negative-phase input terminal 13 has a low voltage (namely, a differential voltage is positive), a current output through the second current output terminal 15 is increased. In contrast, when the differential voltage is negative, the current output through the second current output terminal 15 is decreased.

Figure 4A:
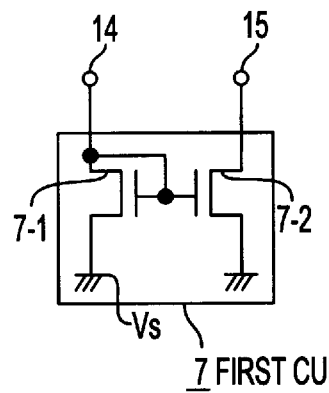
FIG. 4(a) is a diagram for showing a configuration of a first current mirror circuit of the operational amplifier, wherein NMOS transistors are used.
Figure 4B:
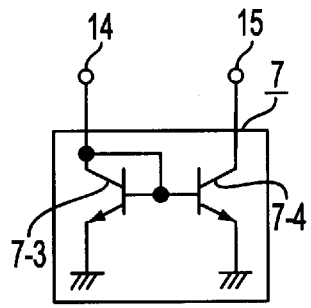
FIG. 4(b) is a diagram for showing another configuration of the first current mirror circuit, wherein NPN transistors are used.
Figure 4C:
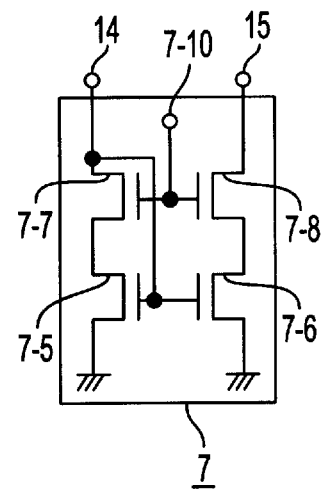
FIG. 4(c) is a diagram for showing still another configuration of the first current mirror circuit, wherein a cascode connection of NMOS transistors is used.

FIGS. 4(a) through 4(c) show examples of the configuration of the first current mirror circuit 7. FIG. 4(a) shows an example where NMOS transistors are used, FIG. 4(b) shows an example where NPN transistors are used, and FIG. 4(c) shows an example where a cascode connection of NMOS transistors is used. In the configuration of FIG. 4(a), the first current mirror circuit 7 includes two NMOS transistors 7-1 and 7-2, which are connected with the ground power supply Vs at their sources, with the first and second current output terminals 14 and 15, respectively at their drains, and with each other at their gates. In the transistor 7-1 connected with the first current output terminal 14, its drain and its source are connected with each other. Accordingly, the current mirror circuit having the configuration of FIG. 4(a) outputs, through the second current output terminal 15, a current having a value in proportion to and a reverse polarity to a current input through the first current output terminal 14. The configuration of FIG. 4(b) includes two NPN transistors 7-3 and 7-4 similarly connected. In the case where the current mirror circuit includes a cascode connection of four NMOS transistors 7-5 through 7-8 as shown in FIG. 4(c), an operational amplifier having a high DC gain can be realized. In FIG. 4(c), a reference numeral 7-10 denotes a bias voltage terminal for the two cascode-connected transistors 7-7 and 7-8.

Figure 5A:
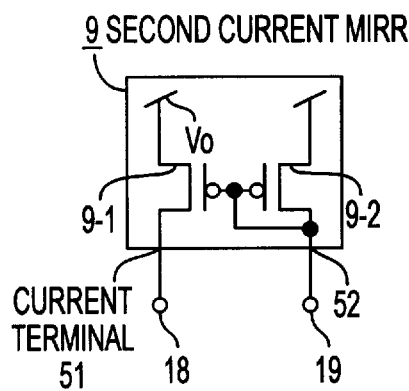
FIG. 5(a) is a diagram for showing a configuration of a second current mirror circuit of the operational amplifier, wherein PMOS transistors are used.
Figure 5B:
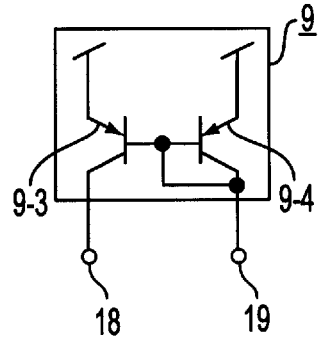
FIG. 5(b) is a diagram for showing another configuration of the second current mirror circuit, wherein PNP transistors are used.
Figure 5C:
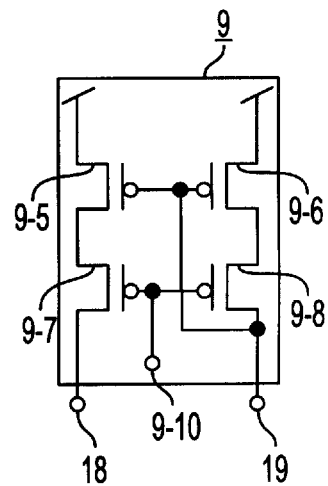
FIG. 5(c) is a diagram for showing still another configuration of the second current mirror circuit, wherein a cascode connection of PMOS transistors is used.

FIGS. 5(a) through 5(c) show examples of the configuration of the second current mirror circuit 9. FIG. 5(a) shows an example where PMOS transistors are used, FIG. 5(b) shows an example where PNP transistors are used, and FIG. 5(c) shows an example where a cascode connection of PMOS transistors is used. The configuration of FIG. 5(a) includes first and second PMOS transistors 9-1 and 9-2, which are connected with the power supply Vo having the low voltage at their sources, with the fifth and sixth current output terminals 18 and 19 at their drains working as current terminals 51 and 52, respectively, and with each other at their gates (working as current control terminals). In the transistor 9-2 connected with the sixth current output terminal 19, its drain and its source are connected with each other. Accordingly, the current mirror circuit having the configuration of FIG. 5(a) outputs, through the current output terminal 51 to the fifth current output terminal 18, a current having a value in proportion to and a reverse polarity to a current input through the sixth current output terminal 19. The fifth current output terminal 18 is connected with the gate (i.e., a current control terminal) of the transistor 10 of the first polarity included in the output buffer circuit 22 of FIG. 1. The configuration of FIG. 5(b) includes two PNP transistors 9-3 and 9-4 similarly connected. In the case where the current mirror circuit includes a cascode connection of four PMOS transistors 9-5 through 9-8 as shown in FIG. 5(c), an operational amplifier having a high DC gain can be realized. In the configuration of FIG. 5(c), a reference numeral 9-10 denotes a bias voltage terminal for the two cascode-connected transistors 9-7 and 9-8.

FIGS. 6(a) and 6(b) show examples of the configuration of the third and fourth constant current sources 3 and 4 and the DC level separating circuit 8 included in the current aliasing circuit 50. FIG. 5(a) shows an example where NMOS transistors are used, and FIG. 5(b) shows an example where NPN transistors are used. In the configuration of FIG. 5(a), the third and fourth constant current sources 3 and 4 respectively include NMOS transistors 3-1 and 4-1, which are connected with the ground power supply Vs at their sources, with the third and fourth current output terminals 16 and 17, respectively at their drains, and with a bias terminal 40 at their gates (current control terminals). Also, the DC level separating circuit 8 includes two NMOS transistors 8-1 and 8-2, which are cascode-connected with the transistors 3-1 and 4-1 of the third and fourth constant current sources 3 and 4, respectively at their sources, connected with the fifth and sixth current output terminals 18 and 19, respectively at their drains, and with the bias terminal 20 at their gates. The bias terminal 20 is supplied with a bias voltage so that the transistors 3-1 and 4-1 of the third and fourth constant current sources 3 and 4 can be operated in a saturation region. The bias terminal 40 is supplied with a constant voltage so that the transistors 3-1 and 4-1 of the third and fourth constant current sources 3 and 4 allow desired current flow. Accordingly, the DC level separating circuit having the configuration of FIG. 6(a) separates a DC voltage level between the third and fifth current output terminals 16 and 18 and between the fourth and sixth current output terminals 17 and 19, and outputs currents flowing through the third and fourth current output terminals 16 and 17 to the fifth and sixth current output terminals 18 and 19.

Also in the configuration of FIG. 6(b), the third and fourth constant current sources 3 and 4 respectively includes NPN transistors 3-2 and 4-2 similarly connected, and the DC level separating circuit 8 includes two NPN transistors 8-3 and 8-4 similarly connected. However, the bias terminal 20 is supplied with a bias voltage so that the transistors 3-2 and 4-2 of the third and fourth constant current sources 3 and 4 can be operated in an unsaturation region.

Figure 7A:
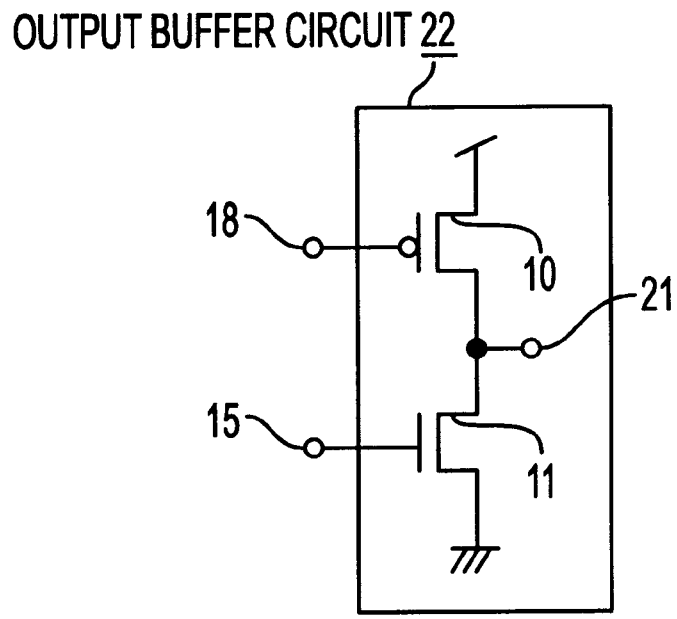
FIG. 7(a) is a diagram for showing a configuration of an output buffer circuit of the operational amplifier, wherein MOS transistors are used.
Figure 7B:
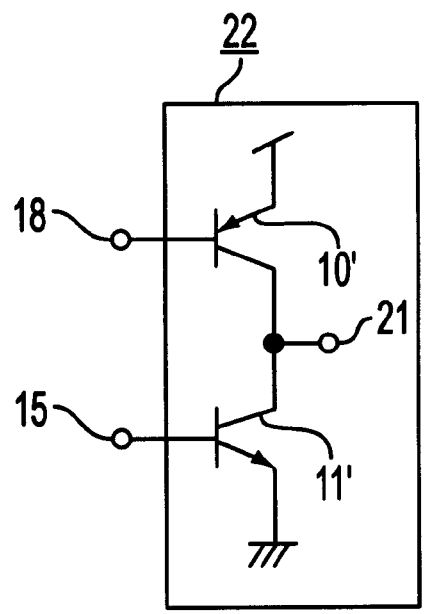
FIG. 7(b) is a diagram for showing another configuration of the output buffer circuit, wherein bipolar transistors are used.

FIGS. 7(a) and 7(b) show examples of the configuration of the output buffer circuit 22. FIG. 7(a) shows an example where MOS transistors are used, and FIG. 7(b) shows an example where bipolar transistors are used. The configuration of FIG. 7(a) includes a serial connection of a PMOS transistor 10 and an NMOS transistor 11, which are connected with the fifth current output terminal 18 and the second current output terminal 15, respectively at their gates. The configuration of FIG. 7(b) similarly includes a serial connection of a PNP transistor 10' and an NPN transistor 11'.

For the maximum exhibition of the effects of the invention, it is preferred that the transistors included in the first current mirror circuit 7 and the transistor 11 of the second polarity included in the output buffer circuit 22 are of the same type and that the transistors included in the second current mirror circuit 9 and the transistor 10 of the first polarity included in the output buffer circuit 22 are of the same type. Specifically, when the first current mirror circuit 7 includes, for example, NMOS transistors, the transistor 11 of the second polarity of the output buffer circuit 22 is preferably an NMOS transistor, and when the first current mirror circuit 7 includes NPN transistors, the transistor 11 of the second polarity of the output buffer circuit 22 is preferably an NPN transistor.

Now, the operation of the operational amplifier of FIG. 1 will be described.

A differential signal is input to the first and second differential current amplifiers 5 and 6. Owing to the input signal, a current value difference is caused between a current output through the first current output terminal 14 and a current output through the second current output terminal 15. Specifically, for example, when it is assumed that a voltage at the negative-phase input terminal 12 is higher than a voltage at the positive-phase input terminal 13 by a small voltage value ΔV, a current output from the first current output terminal 14 is decreased from a current output in the steady-state by a small current value ΔI, and a current output from the second current output terminal 15 is contrary increased from a current output in the steady-state by the small current value ΔI. When a current mirror ratio of the first current mirror circuit 7 is set at "1", a current having the same value as a current input through the first current output terminal 14 is extracted from the second current output terminal 15 to the first current mirror circuit 7. In other words, the first current mirror circuit 7 outputs a current having the same value as but having a reverse polarity to the current input through the first current output terminal 14.

Accordingly, in the second current output terminal 15, a current supplied from the first differential current amplifier 5 is increased by the small current value ΔI and a current supplied from the first current mirror circuit 7 is decreased by the small current value ΔI. Therefore, a current with a value 2ΔI, namely, of twice of the small current value ΔI, is allowed to flow to be output to the current control terminal (gate or base) of the transistor 11 of the second polarity (N-type transistor in FIG. 7) of the output buffer circuit 22. As a result, a voltage at the current control terminal of the transistor 11 of the second polarity is increased, so as to increase the value of a current flowing from the ground power supply Vs to the output terminal 21 through the transistor 11 of the second polarity.

On the other hand, the differential signal input to the first differential current amplifier 5 is also input to the second differential current amplifier 6. Accordingly, in the same manner as described above, a current flowing from the second differential current amplifier 6 to the third current output terminal 16 is increased by the small current value ΔI, and a current flowing to the fourth current output terminal 17 is decreased by the small current value ΔI. Since the third and fourth constant current sources 3 and 4 always supply a constant current, two currents input to the DC level separating circuit 8 are respectively increased and decreased by the small current value ΔI. As a result, a current flowing to the fifth current output terminal 18 is decreased by the small current value ΔI, and a current flowing to the sixth current output terminal 19 is increased by the small current value ΔI. Since the second current mirror circuit 9 outputs, through the fifth current output terminal 18, a current having the same value as the current flowing to the sixth current output terminal 19, a current with a value 2ΔI, namely, a twice of the small current value ΔI, is output to the current control terminal of the transistor 10 of the first polarity (P-type transistor in FIG. 7) of the output buffer circuit 22. As a result, a voltage at the current control terminal of the transistor 10 of the first polarity is increased, so as to decrease a current flowing from the power supply Vo having the low voltage to the output terminal 21 through the transistor 10 of the first polarity.

Accordingly, the currents flowing through the transistors 10 and 11 having the different polarities included in the output buffer circuit 22 have different values, and hence, the resultant differential current alone is output from the output terminal 21.

Thus, the operational amplifier of this embodiment has the class-AB output configuration for driving both the transistor 10 of the first polarity and the transistor 11 of the second polarity included in the output buffer circuit 22 by using the differential signal.

Figure 8:
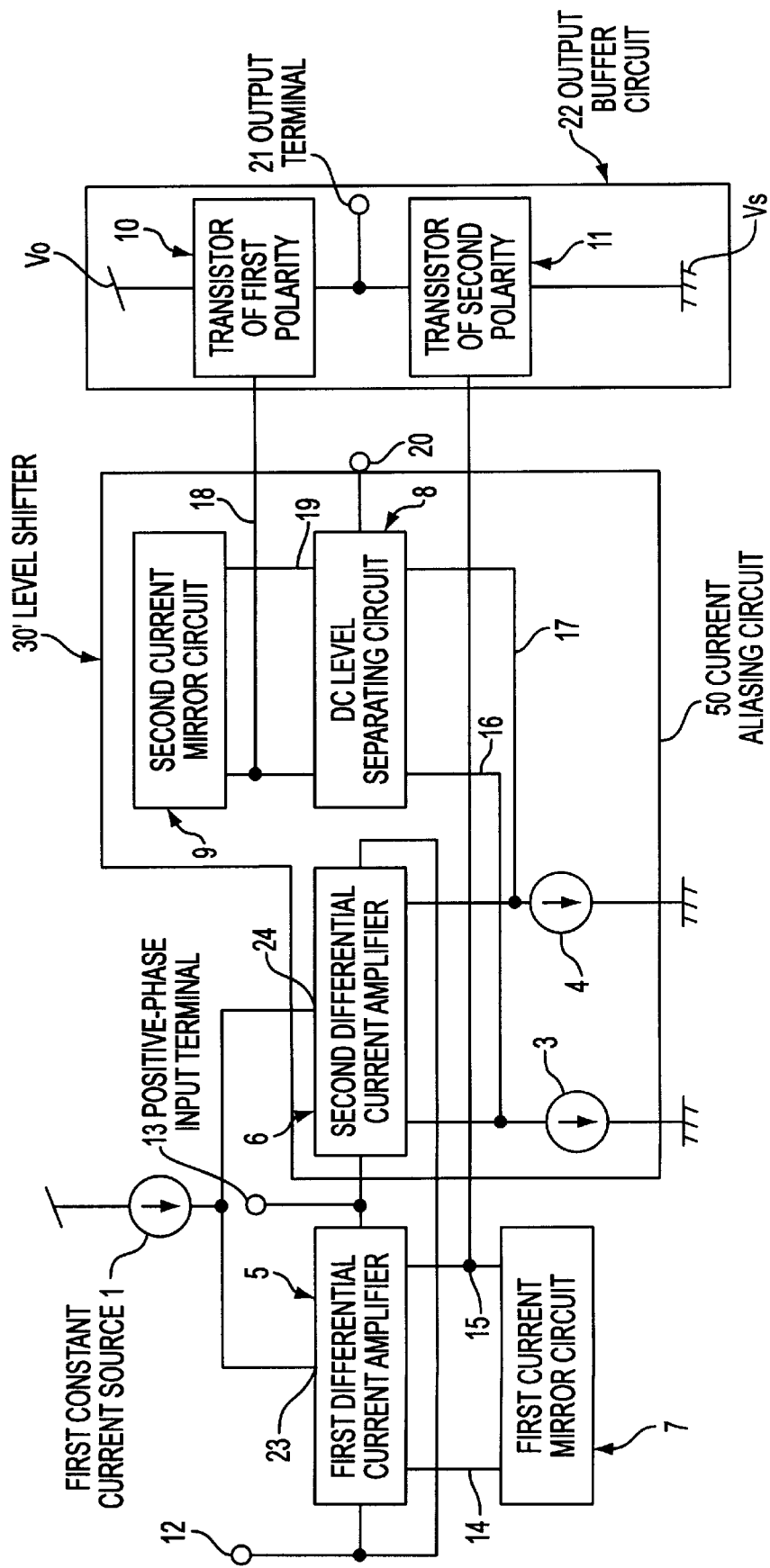
FIG. 8 is a block diagram for showing modification of the operational amplifier of the invention.

FIG. 8 shows modification of the operational amplifier of the above-described embodiment.

In FIG. 8, a level shifter 30' of the modified operational amplifier does not include the second current source 2 as the level shifter 30 of the aforementioned operational amplifier shown in FIG. 1 but includes merely the first current source 1 working also as the second current source 2. This operational amplifier has the same signal path as that of the above-described embodiment, and hence, the operational amplifier according to this modification also can realize the class-AB output similarly to that of the above-described embodiment.

Figure 9:
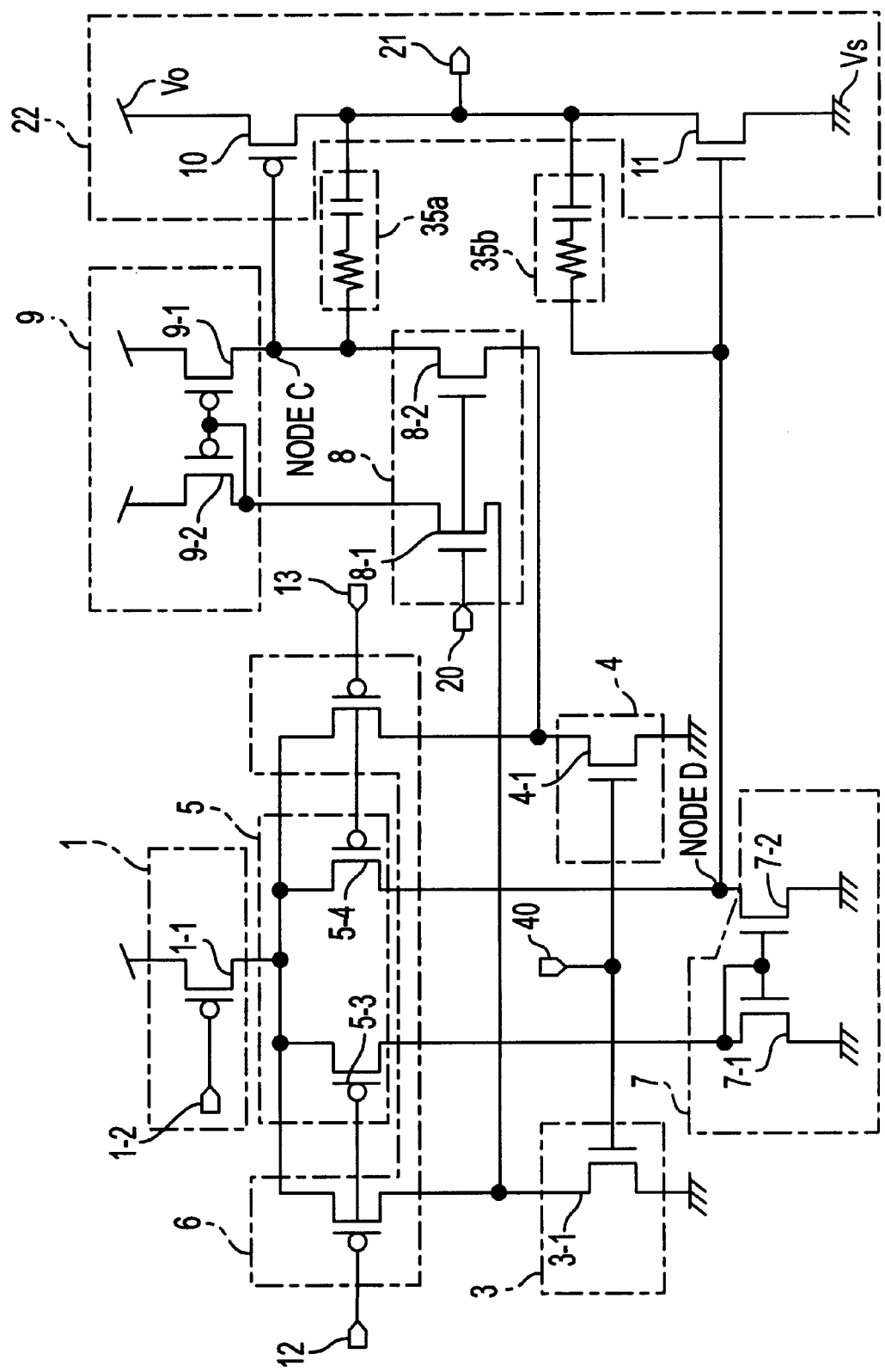
FIG. 9 is a diagram for showing a specific configuration of the modified operational amplifier of FIG. 8.

FIG. 9 shows a specific configuration of the operational amplifier of FIG. 8 using MOS transistors. Specifically, the first current source 1 has the configuration of FIG. 2(a), the first and second differential current amplifiers 5 and 6 have the configuration of FIG. 3(a), the first current mirror circuit 7 has the configuration of FIG. 4(a), the second current mirror circuit 9 has the configuration of FIG. 5(a), the third and fourth constant current sources 3 and 4 and the DC level separating circuit 8 have the configuration of FIG. 6(a), and the output buffer circuit 22 has the configuration of FIG. 7(a). However, in the first and second differential current amplifiers 5 and 6, the resistance elements 5-1 and 5-2 of FIG. 3(a) are omitted. Also, the output buffer circuit 22 includes phase compensating circuits 35a and 35b additionally to the PMOS and NMOS transistors 10 and 11.

Now, it will be specifically described, with reference to FIG. 9, that the present operational amplifier can be operated with the power supply Vo having the low voltage without fail.

As is obvious from FIG. 9, a voltage required for the operation of the operational amplifier is a sum of the gate-source voltage of the transistor 9-2 of the second current mirror circuit 9, the drain-source voltage of the transistor 8-1 of the DC level separating circuit 8 and the drain-source voltage of the transistor 3-1 of the third constant current source 3. Assuming that the gate-source voltage of each transistor is 0.9 V and the drain-source voltage is 0.2 V, the sum of these voltages is approximately 1.3 V. Thus, the operational amplifier can be operated at a supply voltage half as low as the conventionally required voltage, ice., 2.7 V.

Subsequently, it will be proved, with reference to FIG. 9, that the value of a current flowing through the output buffer circuit in the steady-state of the present operational amplifier is scarcely varied even in using the power supply Vo having a different voltage. In the steady-state of the operational amplifier of FIG. 9, currents flowing through the first and second differential current amplifiers 5 and 6 are equal to each other, namely, the following equations hold:

Equations 4:

$$Vgs(10) = Vgs(9\text{-}1) = Vgs(9\text{-}2)$$

$$Vgs(11) = Vgs(7\text{-}2) = Vgs(7\text{-}1)$$

The numerals in the parentheses in these equations correspond to the reference numerals of the transistors of FIG. 9. Accordingly, the following equations hold with regard to currents flowing through the respective transistors:

Equations 5:

$$Ids(10)/Ids(9\text{-}2) = A(10)/A(9\text{-}2)$$

$$Ids(11)/Ids(7\text{-}1) = A(11)/A(7\text{-}1)$$

wherein A=(gate width of transistor)/(gate length of transistor).

The drain-source current Ids of the transistor 9-2 of the second current mirror circuit 9 is determined on the basis of currents in the transistors 1-1, 3-1 and 4-1 of the first, third and fourth constant current sources 1, 3 and 4, and the drain-source current Ids of the transistor 7-1 of the first current mirror circuit 7 is determined on the basis of a current in the transistor 1-1 of the first constant current source 1. Thus, the drain-source currents in the above-described equations are determined regardless of the voltage value of the power supply Vo.

Figure 15A:
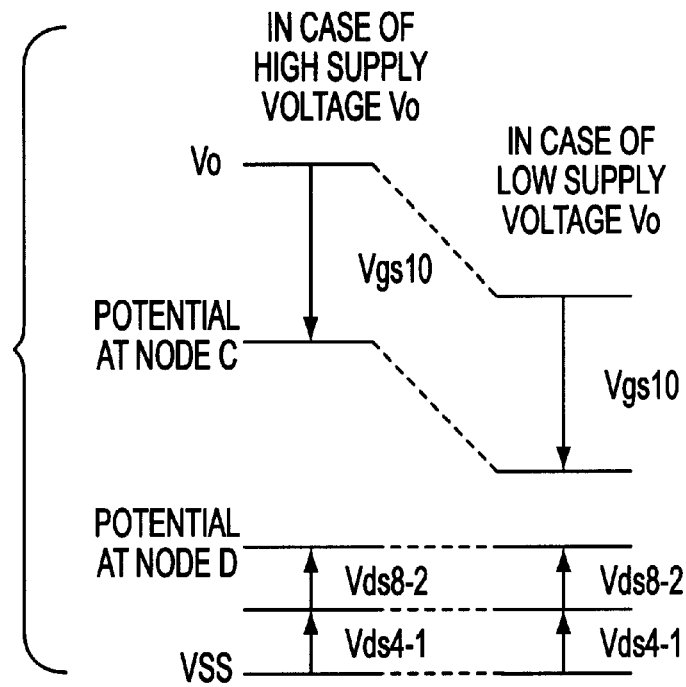
FIG. 15(a) shows variation in a bias voltage of a transistor of a first polarity included in the output buffer circuit obtained under high and low supply voltages.
Figure 15B:
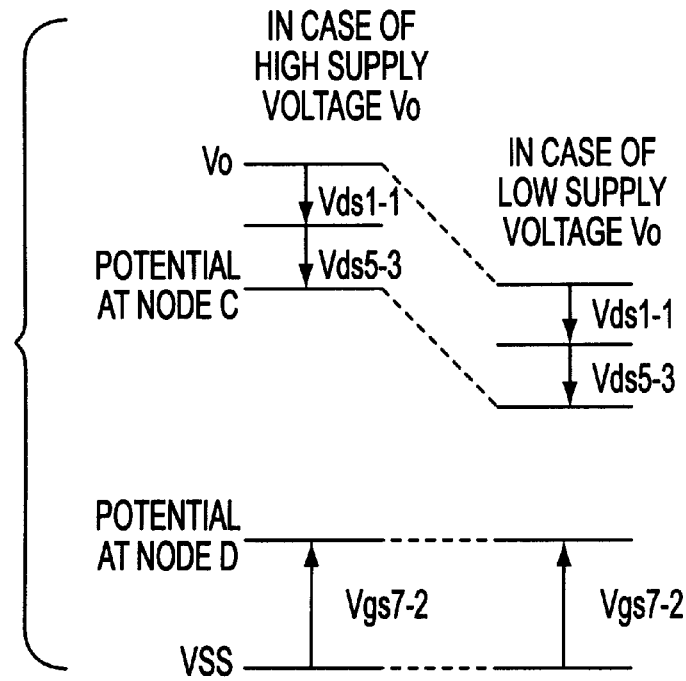
FIG. 15(b) shows variation in a bias voltage of a transistor of a second polarity included in the output buffer circuit obtained under high and low supply voltages.
Figure 16:
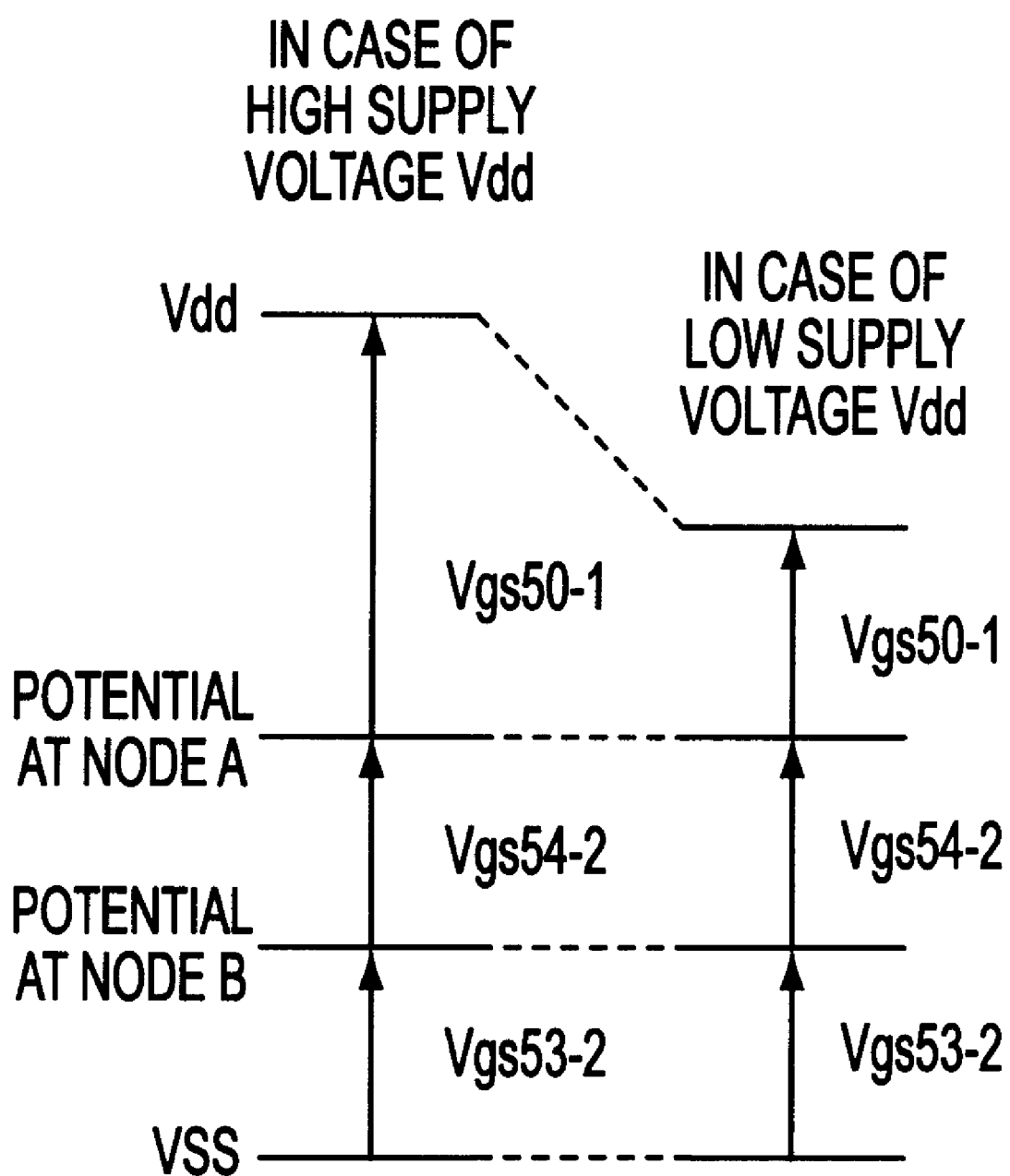
FIG. 16 shows variation in a bias voltage of one of transistors (connected with a power supply) included in the output buffer circuit of the conventional operational amplifier obtained under high and low supply voltages.

Now, the operation of the present operational amplifier will be described in detail with reference to FIGS. 15(a) and 15(b). As is shown in FIG. 15(a), the potential at a node C of FIG. 9, which determines the output current of the transistor 10 of the first polarity included in the output buffer circuit 22, is determined by the transistor 9-1 of the second current mirror circuit 9, and is specifically a voltage Vo-Vgs9-1, which is a voltage lower than the supply voltage of the power supply Vo by the gate-source voltage Vgs9-1 of the transistor 9-1. The gate-source voltage Vgs10 of the transistor 10 of the first polarity included in the output buffer circuit 22 is equal to the gate-source voltage Vgs9-1 of the transistor 9-1 of the second current mirror circuit 9. Similarly, as is shown in FIG. 15(b), the potential at node D of FIG. 9, which determines the output current of the transistor 11 of the second polarity included in the output buffer circuit 22, is determined by the transistor 7-2 of the first current mirror circuit 7, and is specifically a voltage Vgs7-2, which is higher than the ground potential by the gate-source voltage Vgs7-2 of the transistor 7-2. The gate-source voltages Vgs9-1 and Vgs7-2 are not varied because the drain-source currents Ids9-1 and Ids7-2 of the transistors 9-1 and 7-2 are constant regardless of the voltage of the supply voltage Vo. Accordingly, the gate-source voltages Vgs10 and Vgs11 of the transistor 10 of the first polarity and the transistor 11 of the second polarity included in the output buffer circuit 22 are also not varied even when the power supply Vo has a different voltage. As a result, the currents flowing through the transistors 10 and 11 in the steady-state have constant values even when the voltage of the power supply Vo is different.

Accordingly, in the present operational amplifier, the currents flowing through the two transistors 10 and 11 of the output buffer circuit 2 in the steady-state have values scarcely affected by the voltage of the used power supply Vo.

Furthermore, since the first and second differential current amplifiers 5 and 6 include the transistors of the same polarity, the input dynamic range of the operational amplifier can be wide. In addition, the DC gain of approximately 60 dB can be easily achieved.

Moreover, since nodes connected with the gates of the PMOS and NMOS transistors 10 and 11 of the output buffer circuit 22 have a high impedance, the gate voltages are largely varied in accordance with variation of output currents of the differential current amplifiers 5 and 6 at the input level. This can largely change the values of the currents flowing through the two transistors 10 and 11 of the output buffer circuit 22, resulting in outputting a large current through the output terminal 21 during the operation.

Figure 10:
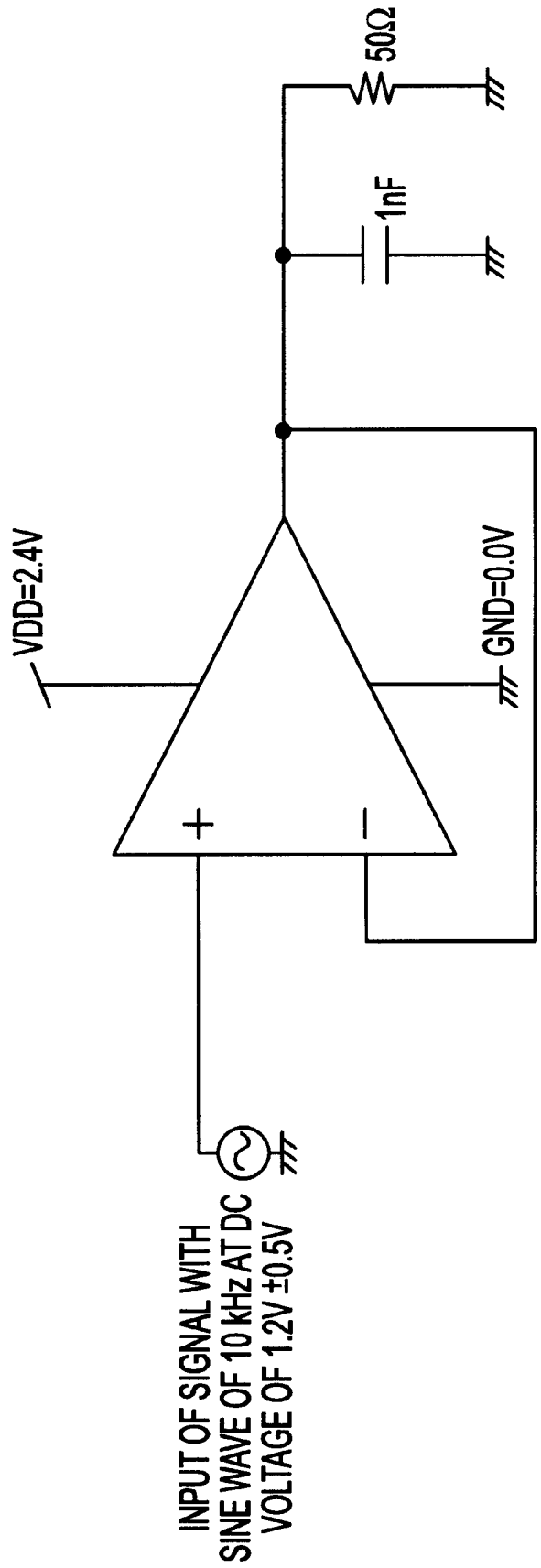
FIG. 10 is a diagram for showing a circuit configuration adopted for simulating the output characteristic of the operational amplifier of FIG. 9.

Next, the operational amplifier of FIG. 9 is actually subjected to simulation, and the results will be described to confirm the effects of the invention. A circuit configuration used in the simulation is shown in FIG. 10. A parallel connection of a capacitance of 1 nF and a resistance of 50 Ω is used as a load to be driven.

Figure 11:
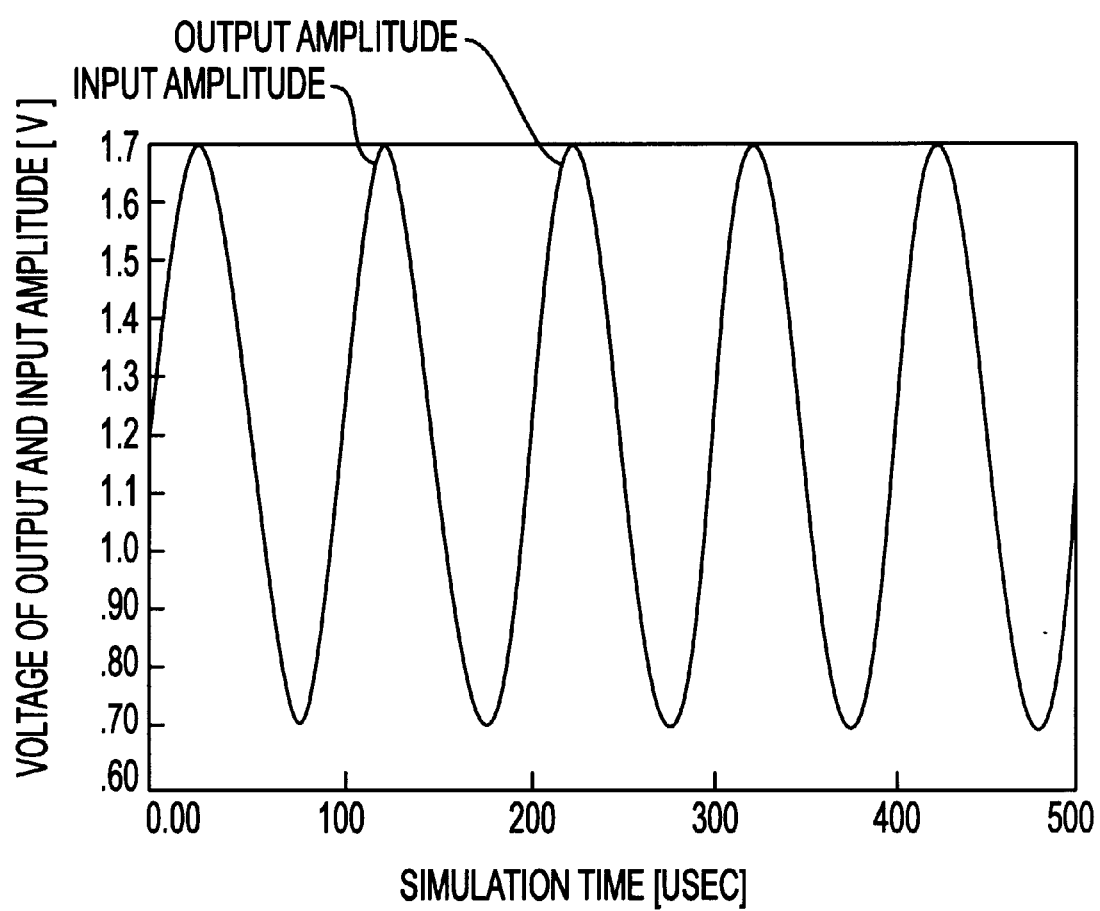
FIG. 11 shows an output waveform resulting from the simulation of the operational amplifier of FIG. 9.

FIG. 11 shows an output waveform of the operational amplifier of FIG. 9 obtained by inputting a signal with a sine wave of 10 kHz at a DC voltage of 1.2 V±0.5 V. Since a voltage-follower circuit configuration is adopted, a signal having substantially the same amplitude as the input signal is output. Thus, the operational amplifier of FIG. 9 is confirmed to be able to satisfactorily drive the load of 50 Ω.

Figure 12:
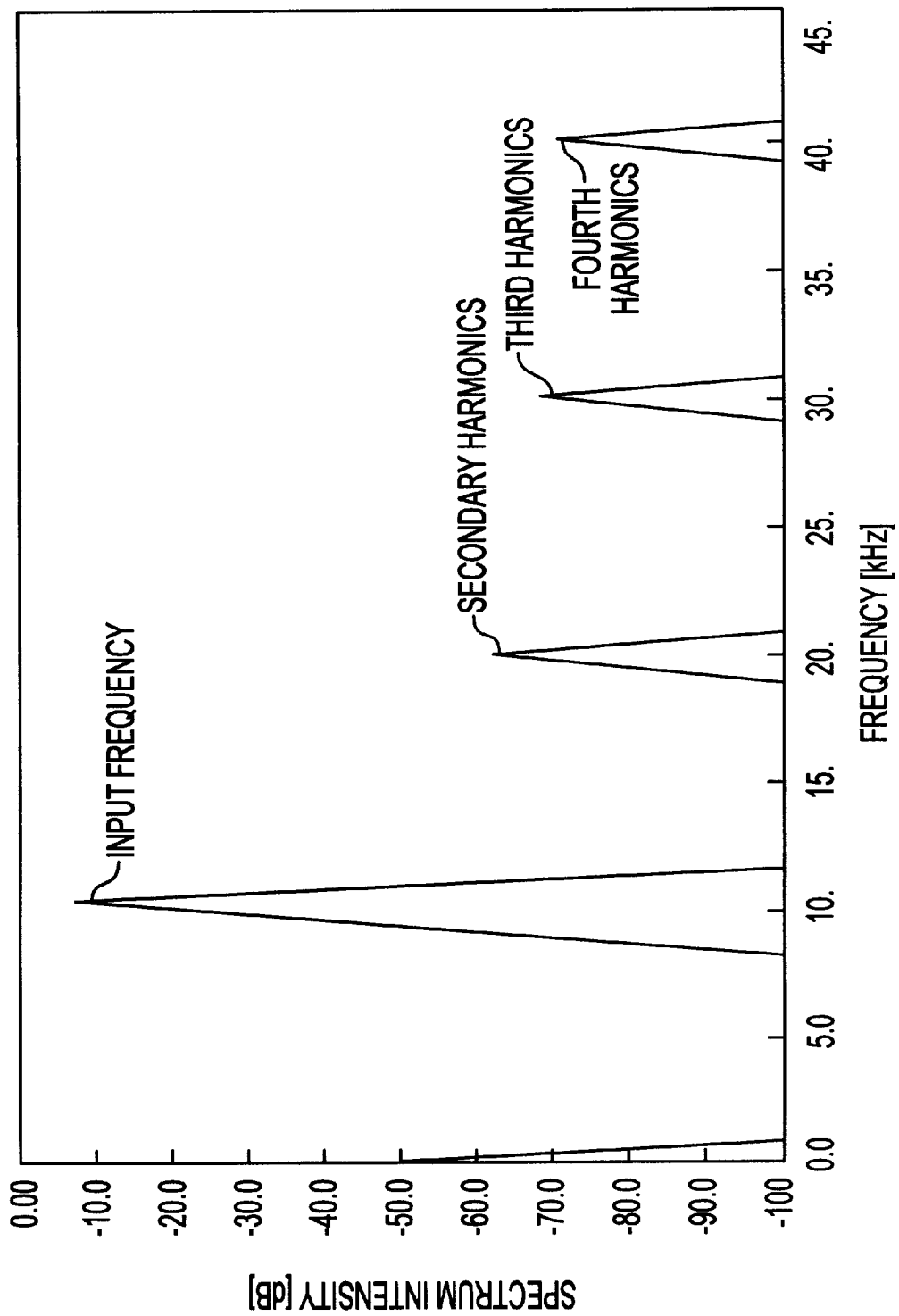
FIG. 12 shows a frequency spectrum of the output waveform resulting from the simulation of the operational amplifier of FIG. 9.
Figure 13:
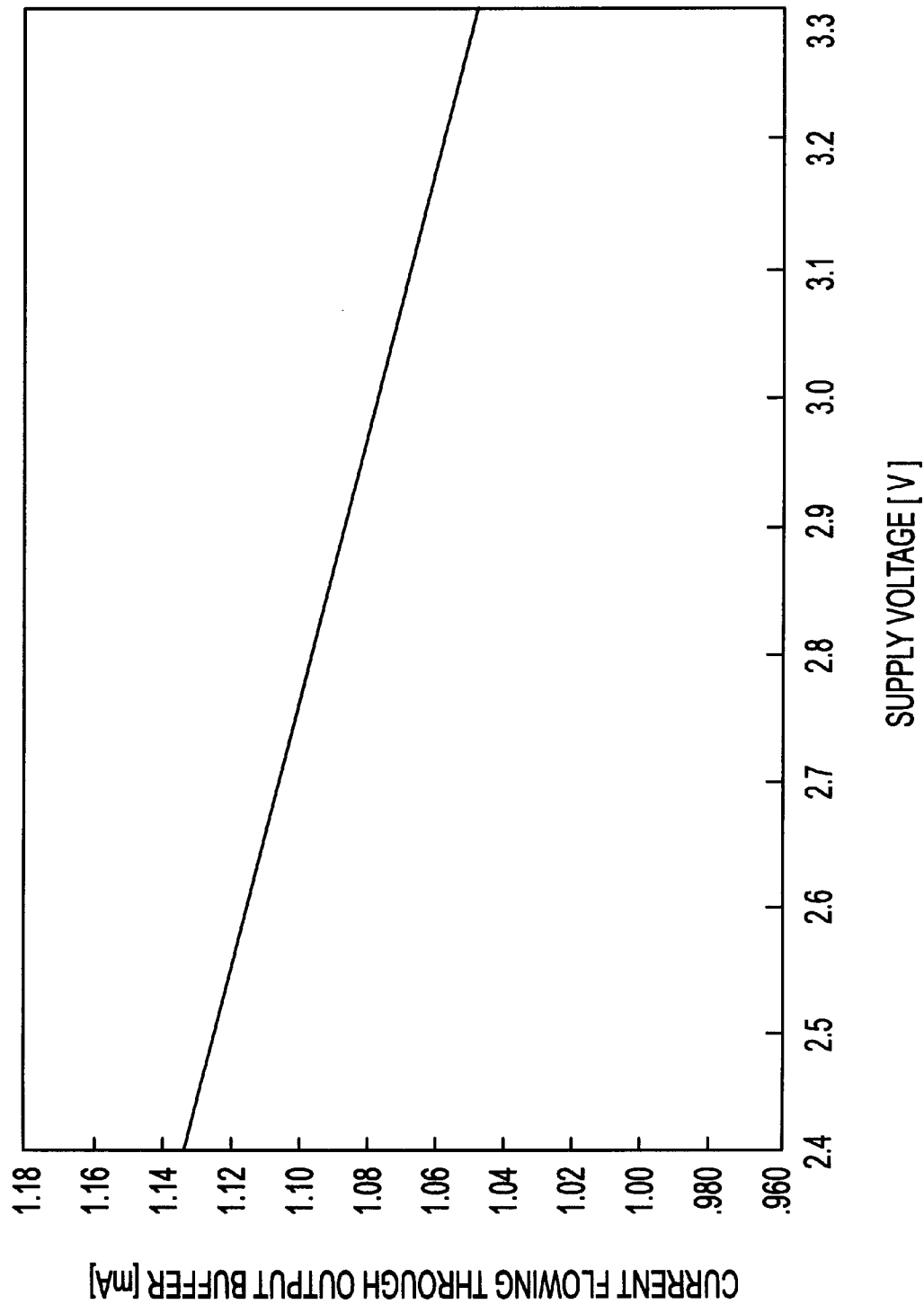
FIG. 13 is a graph of the result of simulation for showing supply voltage dependency of a current value in the output buffer circuit of the operational amplifier of FIG. 9 in a steady-state.
Figure 14:
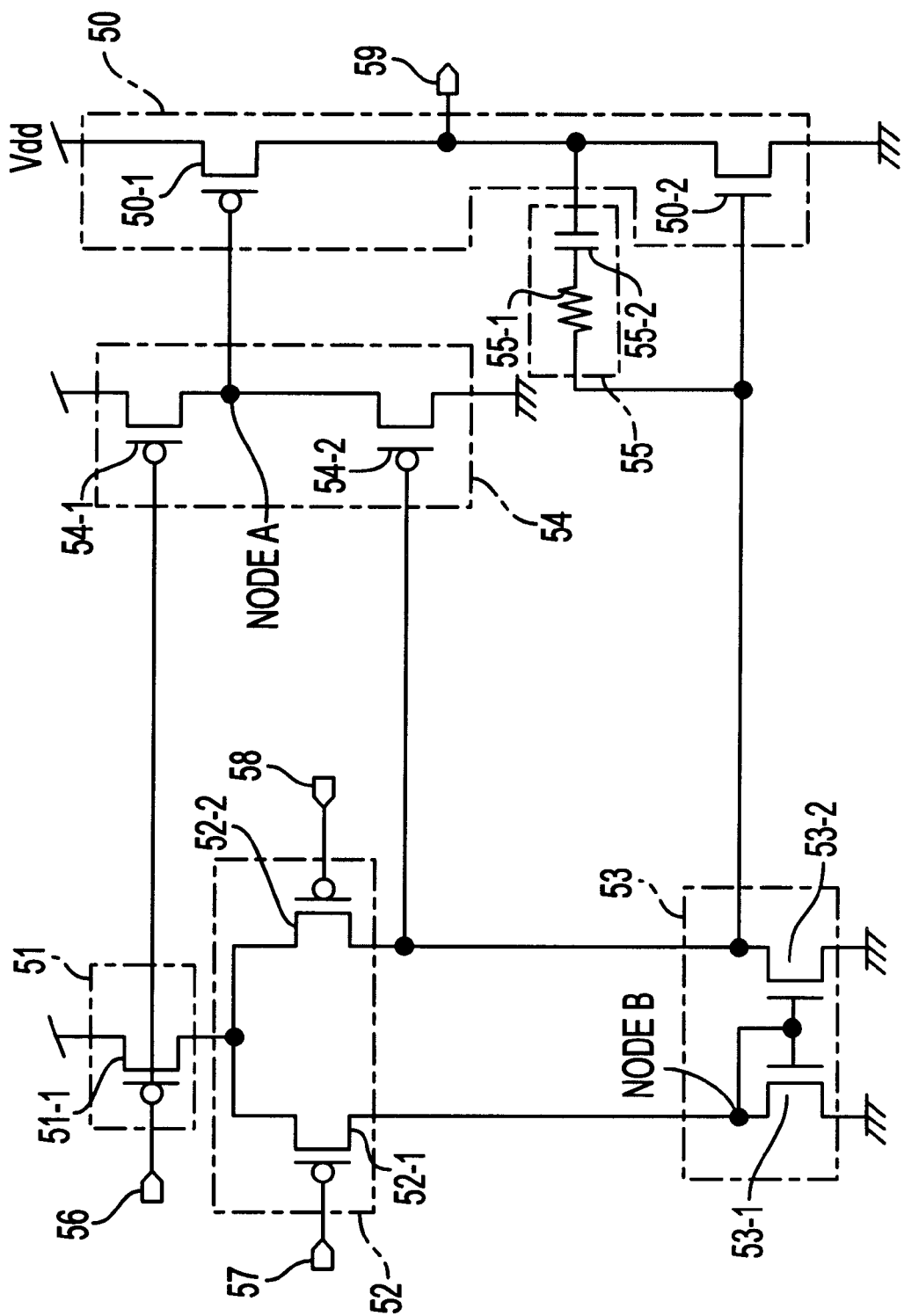
FIG. 14 is a diagram for showing a specific configuration of a conventional operational amplifier.

FIG. 12 shows a frequency spectrum of the output waveform. As is shown in FIG. 12, the secondary harmonic distortion is found at approximately −60 dB, and it is confirmed that there is no problem in the quality of the output waveform. FIG. 13 shows the relationship between a supply voltage and a current value of a current flowing through the PMOS and NMOS transistors 10 and 11 of the output buffer circuit 22 in the operational amplifier of FIG. 9. Even when the supply voltage is changed from 2.4 V to 3.3 V, the value of the current flowing through these transistors is varied by merely approximately 10%. Thus, it is confirmed that the value of a current flowing through these transistors in the steady-state is not easily affected by the variation in the voltage of the used power supply Vo.

In this manner, it is proved that the operational amplifier according to the invention can be operated sufficiently and definitely at a low voltage and has a configuration not easily affected by variation in the voltage of a used power supply.

The effects of the invention are not limitedly exhibited by the aforementioned embodiment. When the PMOS transistors and the NMOS transistors are replaced with each other and the supply voltage is replaced with the ground voltage in the operational amplifier of FIG. 9, the effects of the invention can be exhibited in the same manner as described in the aforementioned embodiment.

The present operational amplifier can be used, for example, in a reproducing apparatus for CDs (compact discs) for amplifying a pickup signal. Such a reproducing apparatus can be either of stationary or of portable. In addition, since the effects of the invention can be exhibited regardless of the voltage of a used power supply as described above, the operational amplifier is applicable to not only a general low voltage power supply but also a lower voltage power supply.

What is claimed is:

1. A class-AB operational amplifier comprising:
   a first power supply having a predetermined voltage;
   a second power supply having a voltage different from said predetermined voltage;
   an output buffer circuit including a serial connection of a transistor of a first polarity connected with said first power supply, a transistor of a second polarity connected with said second power supply and an output terminal provided at a node between said transistors, said transistors being driven by using an input differential signal;
   a first differential current amplifier including transistors of a predetermined polarity for receiving the differential signal for amplification and driving said transistor of the second polarity; and
   a level shifter for generating a voltage to be supplied to a current control terminal of said transistor of the first polarity in order to drive said transistor of the first polarity,
   wherein said level shifter includes:
      a constant current source for supplying a constant current;
      a second differential current amplifier including transistors of the same polarity as said transistors included in said first differential current amplifier for receiving the constant current from said constant current source and receiving the differential signal for amplification;
      a current aliasing circuit connected between said second differential current amplifier and said second power supply for looping an output current of said second differential current amplifier; and
      a current mirror circuit connected between said first power supply and said current aliasing circuit for allowing a current having a current value based on an output current of said current aliasing circuit to flow and to be supplied to the current control terminal of said transistor of the first polarity.

2. The operational amplifier of claim 1,
   wherein said current aliasing circuit includes:
      two constant current sources respectively connected with two current output terminals of said second differential current amplifier; and
      a DC level separating circuit having two current output terminals for outputting currents flowing to said two current output terminals of said second differential current amplifier respectively through said two current output terminals of said DC level separating circuit and for separating a DC voltage level between said two current output terminals thereof and said two current output terminals of said second differential current amplifier.

3. The operational amplifier of claim 2,
   wherein one of said two constant current sources of said current aliasing circuit includes a transistor connected between one of said current output terminals of said second differential current amplifier and said second power supply,
   the other constant current source of said current aliasing circuit includes a transistor connected between the other current output terminal of said second differential current amplifier and said second power supply, and
   said two transistors of said constant current sources are commonly connected with a bias terminal at current control terminals thereof.

4. The operational amplifier of claim 2,
   wherein said DC level separating circuit includes two transistors respectively connected between said two current output terminals thereof and said two current output terminals of said second differential current amplifier, and
   said two transistors of said DC level separating circuit are commonly connected with a bias terminal at current control terminals thereof.

5. The operational amplifier of claim 1,
   wherein said current mirror circuit is connected with said first power supply,
   said current mirror circuit has two current terminals connected with said current aliasing circuit, and outputs, through one of said current terminals, a current having a current value in proportion to and a reverse polarity to a current input to the other current terminal, and
   said current output by said current mirror circuit is supplied to the current control terminal of said transistor of the first polarity.

6. The operational amplifier of claim 5,
   wherein said current mirror circuit includes a first transistor interposed between said first power supply and one of said current terminals thereof and a second transistor interposed between said first power supply and the other current terminal thereof, and said first and second transistors are connected with each other at current control terminals thereof, and the current control terminal of said second transistor is also connected with another terminal thereof which is connected with said other current terminal.

7. The operational amplifier of claim 1 further comprising a current mirror circuit connected between said first differential current amplifier and said second power supply, wherein said additional current mirror circuit allows a current having a current value based on an output current of said first differential current amplifier to flow and to be output to a current control terminal of said transistor of the second polarity.

8. The operational amplifier of claim 1, wherein said first differential current amplifier is provided with a constant current source for supplying a constant current, and said constant current source of said first differential current amplifier also works as a constant current source for supplying the constant current to said second differential current amplifier.

9. The operational amplifier of claim 1, wherein a voltage Vo of said first power supply is set to satisfy the following relationship:

$$Vo < 3\, Vt$$

wherein Vt indicates a threshold voltage of said transistors included in said operational amplifier.

10. The operational amplifier of claim 9, wherein said first power supply has a voltage of 1.3 V.

11. The operational amplifier of claim 6, wherein said transistor of the first polarity included in said output buffer circuit and said transistors of said current mirror circuit included in said level shifter are of the same type and of the same polarity.

12. The operational amplifier of claim 7, wherein said transistor of the second polarity included in said output buffer circuit and said transistors of said current mirror circuit connected with said first differential current amplifier are of the same type and of the same polarity.

* * * * *